United States Patent [19]
Eschauzier et al.

[11] Patent Number: 6,127,891
[45] Date of Patent: Oct. 3, 2000

[54] LOW VOLTAGE CLASS AB AMPLIFIER WITH GAIN BOOSTING

[75] Inventors: Rudy G. H. Eschauzier, Bergschenhoek, Netherlands; Rehan A. Zakai, Milpitas, Calif.

[73] Assignee: National Semiconductor Corporation, Santa Clara, Calif.

[21] Appl. No.: 09/286,363

[22] Filed: Apr. 5, 1999

[51] Int. Cl.$^7$ ................................................ H03F 3/45
[52] U.S. Cl. ........................................ 330/255; 330/261
[58] Field of Search .............................. 330/253, 255, 330/257, 261

[56] References Cited

U.S. PATENT DOCUMENTS

| | | | |
|---|---|---|---|
| 5,289,058 | 2/1994 | Okamoto | 307/490 |
| 5,504,458 | 4/1996 | Van Brunt et al. | 330/255 |
| 5,513,389 | 4/1996 | Reeser et al. | 455/311 |
| 5,621,357 | 4/1997 | Botti et al. | 330/253 |
| 5,621,374 | 4/1997 | Harkin | 337/151 |
| 5,642,078 | 6/1997 | Navabi et al. | 330/253 |
| 5,789,980 | 8/1998 | Nagata et al. | 330/253 |
| 5,907,259 | 5/1999 | Yamada et al. | 327/563 |
| 5,990,742 | 11/1999 | Suzuki | 330/253 |

OTHER PUBLICATIONS

R Hogervorst et al., "A Programmable 3–V CMOS Rail–to–Rail Opamp with Gain Boosting for Driving Heavy Resistive Loads", IEEE International Symposium on Circuits and Systems Proceedings of the 1995 IEEE International Symposium on Circuits and Systems—ISCAS 95. Part 2 (of 3) Apr. 30–May 3, 1995 v2 1995, Seattle, WA, USA, pp. 1544–1547.

K. de Langen et al., "Compact 1.8V Low–Power CMOS Operational Amplifier Cells for VLSI", ISSCC Digest of Technical Papers, 1997 IEEE International Solid–State Circuits Conference, Feb. 1997, pp. 346–348.

*Primary Examiner*—Benny Lee
*Assistant Examiner*—Henry Choe
*Attorney, Agent, or Firm*—Baker & McKenzie

[57] ABSTRACT

A low voltage amplifier with gain boosting and a reduced power supply voltage requirement. A cascode amplifier circuit, biased with the power supply voltage, amplifies a pair of related, differential input signals based upon a pair of gain boost control signals and in accordance therewith provides a pair of gain boosted signals which correspond to the input signals. A gain boost control circuit, also biased with the power supply voltage, uses the differential input signals to generate the gain boost control signals. A class AB amplifier circuit, also biased with the power supply voltage, amplifies the gain boosted signals and in accordance therewith provides a class AB output signal which corresponds to the original input signals. The cascode amplifier circuit, gain boost control circuit and class AB amplifier circuit together operate with a minimum power supply voltage which equals a sum of one active transistor input bias potential and two active transistor output bias potentials $$(V_{DD(min)} - V_{SS} = V_{gs} + V_{dsat} + V_{ce}).$$

20 Claims, 3 Drawing Sheets

LOW VOLTAGE CLASS AB AMPLIFIER WITH GAIN BOOSTING

BACKGROUND OF THE INVENTION

1. Field of the Invention

The present invention relates to class AB amplifiers, and in particular, to low voltage class AB amplifiers with gain boosting and reduced power supply voltage requirements.

2. Description of the Related Art

As the demand for portable, battery operated devices has increased and transistor geometries continue to shrink, the use of low voltage circuits (i.e., circuits which operate at reduced power supply voltages, such as 2.5 and 1.8 volts) continue to increase. However, as the power supply voltage decreases, it becomes more difficult to maintain sufficiently high gain without increasing the complexity of the circuitry. For example, in low voltage circuits, high DC gain is generally achieved by cascading several gain stages. However, this can significantly increase the complexity of the circuit. This is particularly undesirable in the case of integrated circuits which have already become, and continue to be, increasingly complex already.

A more elegant solution is the use of gain boosting. Gain boosting is a technique by which an amplifier is used to enhance the output impedance of a gain stage and thereby increase the voltage gain when driving a high impedance load such as the gate terminal of a metal oxide semiconductor field effect transistor (MOSFET).

Referring to FIG. 1, one technique of gain boosting involves the use of an operational amplifier A to control the gate of a cascode transistor M used for amplifying an input current signal $i_{in}$ which has been generated by a preceding transconductance stage (not shown) which, in turn, has converted an input voltage to this input current $i_{in}$. As is well known, in a traditional cascode circuit, the source terminal of the cascode transistor experiences a small voltage variation (due to the varying current flowing through the channel of the transistor and the finite source impedance) which modulates the input signal current $i_{in}$. However, adding the amplifier A in this manner creates a feedback loop (due to the connection of the source terminal to the inverting input of the amplifier A) which fixes the voltage at the source terminal at the potential of the reference voltage $V_{ref}$ (applied at the non-inverting input of the amplifier A). This forces all of the input signal current $i_{in}$ to go into the cascode transistor M and the impedance at the source terminal of the cascode transistor M to be reduced. Since all of the current flowing into the source terminal of the cascode device will reappear at its drain terminal, the circuit now becomes an almost ideal current source, thereby providing a very high output impedance $Z_{out}$. A small signal analysis of this circuit will indicate that the output impedance $Z_{out}$ is increased and the input impedance $Z_{in}$ is decreased as represented below in Equations 1 and 2 (where: $g_m$=transconductance of transistor M; A=gain of amplifier A; $r_{O1}$=output resistance of transistor M; and $r_{O2}$=output resistance of current sink circuit I2).

$$z_{out} = g_m r_{o1}(A+1) r_{o2} \quad (1)$$

$$z_{in} = \frac{1}{g_m(A+1)} \quad (2)$$

Referring to FIG. 2, one circuit design that makes use of gain boosting to achieve high DC gain amplifies a differential input current signal $i_{in1}/i_{in2}$ to generate a single-ended output voltage $V_{out}$. (Further discussion of this circuit can be found in Hogervorst et al., "A Programmable 3-V CMOS Rail-to-Rail Opamp With Gain Boosting For Driving Heavy Resistive Loads," IEEE International Symposium on Circuits and Systems Proceedings, Apr. 30–May 3, 1995, pp. 1544–47, which is incorporated herein by reference.) This circuit uses operational amplifiers A1 (transistors M51, M52 and M54) and A2 (transistors M55, M56 and M58) to provide gain boosting for cascode transistors M23 and M27 which amplify the two input signal components $i_{in1}$, $i_{in2}$. The resulting amplified signals drive the gate terminals of the class AB output transistors M65, M60.

In accordance with the foregoing discussion, the effective input impedances at the source terminals of the cascode transistors M23, M27 are reduced by the actions of the gain boosting circuits A1, A2, thereby allowing all of the signal currents $i_{in1}$, $i_{in2}$ to flow into the cascode transistors M23, M27. A major disadvantage of this feed forward type of circuit, however, is the fact that it has a relatively high minimum operating voltage requirement $(V_{DD(min)}-V_{SS})$ of approximately 2.7 volts. In terms of the NMOS transistors, this minimum operating voltage $(V_{DD(min)}-V_{SS})$ reflects the sum of two active transistor input bias potentials, i.e., the gate-source bias potentials of transistors M60 and M46, and an active transistor output bias potential, i.e., the saturated drain-source bias potential of the MOSFET providing the bias current $I_{bias}$ for transistors M44 and M45. In terms of the PMOS transistors, this minimum operating voltage $(V_{DD(min)}-V_{SS})$ reflects the gate-source voltages of transistors M65 and M42 and the saturated drain-source voltage of the PMOS transistor providing the bias current $I_{bias}$ for transistors M40 and M41. (As between the two, the minimum voltage requirement imposed by the PMOS transistors will be more stringent due to their higher threshold voltage.) Accordingly, this minimum voltage requirement makes this circuit unsuitable for operation with a 1.8 volt power supply voltage.

Referring to FIG. 3, another low voltage class AB amplifier design does provide for operation at a minimum operating voltage $(V_{DD(min)}-V_{SS})$ of approximately 1.8 volts. (Further discussion of this circuit can be found in De Langen et al., "Compact 1.8 V Low-Power CMOS Operational Amplifier Cells for VLSI," ISSCC Digest of Technical Papers, February 1997, pp. 346, 347 and 483, which is incorporated herein by reference.) In this circuit, two differential input current signals $-i_{in1}/+i_{in1}$, $-i_{in2}/+i_{in2}$, which are generated by a preceding transconductance stage (not shown), are amplified. The positive phase $+i_{in1}$ of the first input current signal $i_{in1}$ drives cascode transistors M15A and M15B, while the positive phase $+i_{in2}$ of the second input current signal $i_{in2}$ drives cascode transistors M13A and M13B. These four transistors M15A, M15B, M13A, M13B also form a differential amplifier for a class AB control. Transistors M60, M61, M62 and M63 form a low voltage class AB feedback current sensing circuit. When the output terminal (common node connection of the drain terminals of transistors M100 and M101) is sourcing or sinking an output current $i_o$ (i.e., pulling the output voltage $v_{out}$ up or down, respectively), these four transistors M60–M63 generate a feedback current $I_{ABfb}$ proportional to the current $i_{100}$ (or $i_{101}$) in the "idle" output device M100 (or M101) ($I_{ABfb}$ lesser of $i_{100}$ and $i_{101}$). When the output current $i_o$ is zero ($i_{100}=i_{101}$), these transistors M60–M63 generate a feedback current $I_{ABfb}$ proportional to the quiescent current flowing in the output devices M100, M101 ($I_{ABfb}$, $i_{100}$, $i_{101}$). This feedback current $I_{ABfb}$ is delivered to a diode connected transistor M47 and is regulated by the class AB amplifier.

This circuit has a minimum operating voltage which is equal to the sum of one gate-source bias potential and two saturated drain-source bias potentials. In terms of the NMOS transistors, this would be the sum of the gate-source bias of transistor M101 and the drain-source bias potentials of transistor M15B and the current source used to generate the bias current $I_{bias}$. In terms of the PMOS transistors, the relevant bias potentials are for transistors M100, M13A and M13. As noted above, this circuit is suitable for operation at 1.8 volts power supply voltage. However, a significant disadvantage of this feedback type of circuit is the limited DC gain due to the limited number (two) of gain stages.

SUMMARY OF THE INVENTION

A low voltage amplifier with gain boosting and reduced power supply voltage requirements in accordance with the present invention provides class AB signal amplification with gain boosting for increased gain and is suitable for operation with a 1.8 volt power supply voltage.

In accordance with one embodiment of the present invention, a low voltage amplifier with gain boosting and a reduced power supply voltage requirement includes power terminals, a gain boost control circuit, a cascode amplifier circuit and a class AB amplifier circuit. The power terminals are configured to convey a power supply voltage. The gain boost control circuit, coupled between the power terminals, is configured to receive the power supply voltage and a plurality of input signals and in accordance therewith provide a plurality of gain boost control signals. The cascode amplifier circuit, coupled between the power terminals and to the gain boost control circuit, is configured to receive the power supply voltage, a portion of the plurality of input signals and the plurality of gain boost control signals and in accordance therewith provide a plurality of gain boosted signals which correspond to the plurality of input signals. The class AB amplifier circuit, coupled between the power terminals and to the cascode amplifier circuit, is configured to receive the power supply voltage and the plurality of gain boosted signals and in accordance therewith provide a class AB output signal which corresponds to the plurality of input signals. Together, the cascode amplifier circuit, gain boost control circuit and class AB amplifier circuit operate with a minimum power supply voltage from the power terminals which equals a sum of one active transistor input bias potential and two active transistor output bias potentials.

In accordance with another embodiment of the present invention, a low voltage amplifier with gain boosting using a dynamically biased cascode amplifier circuit includes bias signal generator circuits, dual cascode amplifier circuits and a class AB amplifier circuit. A first bias signal generator circuit is configured to receive a first differential input signal and in accordance therewith provide a first bias signal. A second bias signal generator circuit is configured to receive a second differential input signal and in accordance therewith provide a second bias signal. A first dual cascode amplifier circuit, coupled to the first bias signal generator circuit, is configured to receive a first bias signal and a portion of a first differential input signal and in accordance therewith provide first and second cascode output signals. A second dual cascode amplifier circuit, coupled to the second bias signal generator circuit and telescopically coupled to the first dual cascode amplifier circuit, is configured to receive a second bias signal and a portion of a second differential input signal and in accordance therewith provide third and fourth cascode output signals. The class AB amplifier circuit, coupled to the first and second dual cascode amplifier circuits, is configured to receive and combine the first and third cascode output signals and receive and combine the second and fourth cascode output signals and in accordance therewith provide a class AB output signal which corresponds to the first and second differential input signals. In a preferred embodiment, the first and second bias signal generator circuits, the first and second dual cascode amplifier circuits and the class AB amplifier circuit together operate with a minimum power supply voltage which equals a sum of one active transistor input bias potential and two active transistor output bias potentials.

These and other features and advantages of the present invention will be understood upon consideration of the following detailed description of the invention and the accompanying drawings.

DETAILED DESCRIPTION OF THE INVENTION

Figure 3:
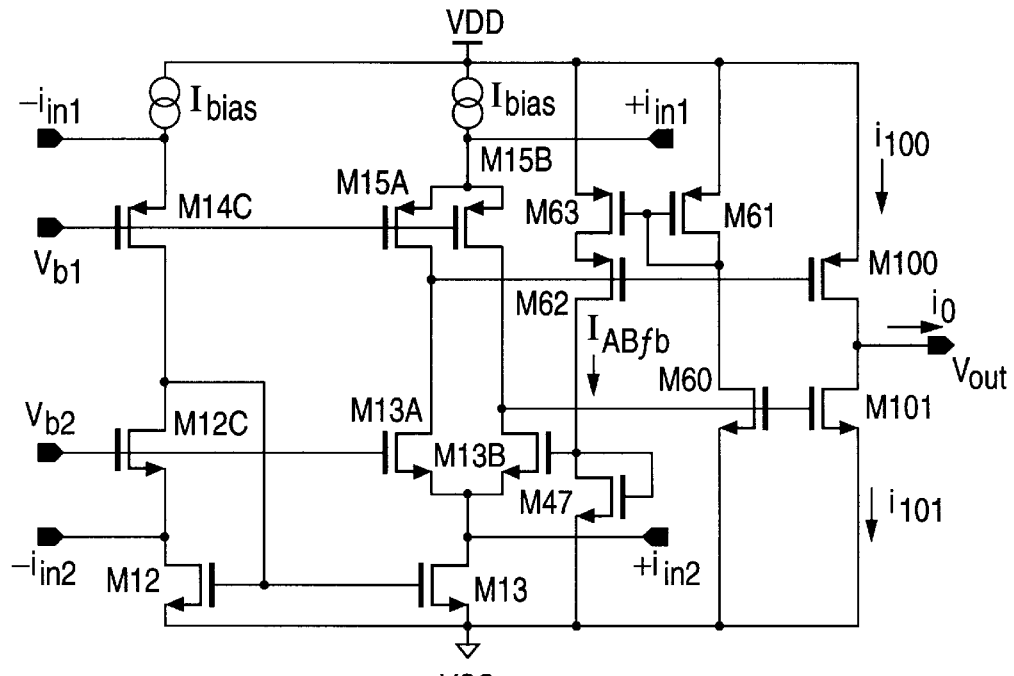
FIG. 3 is a schematic of a conventional circuit providing for operation at reduced power supply voltages.
Figure 4:
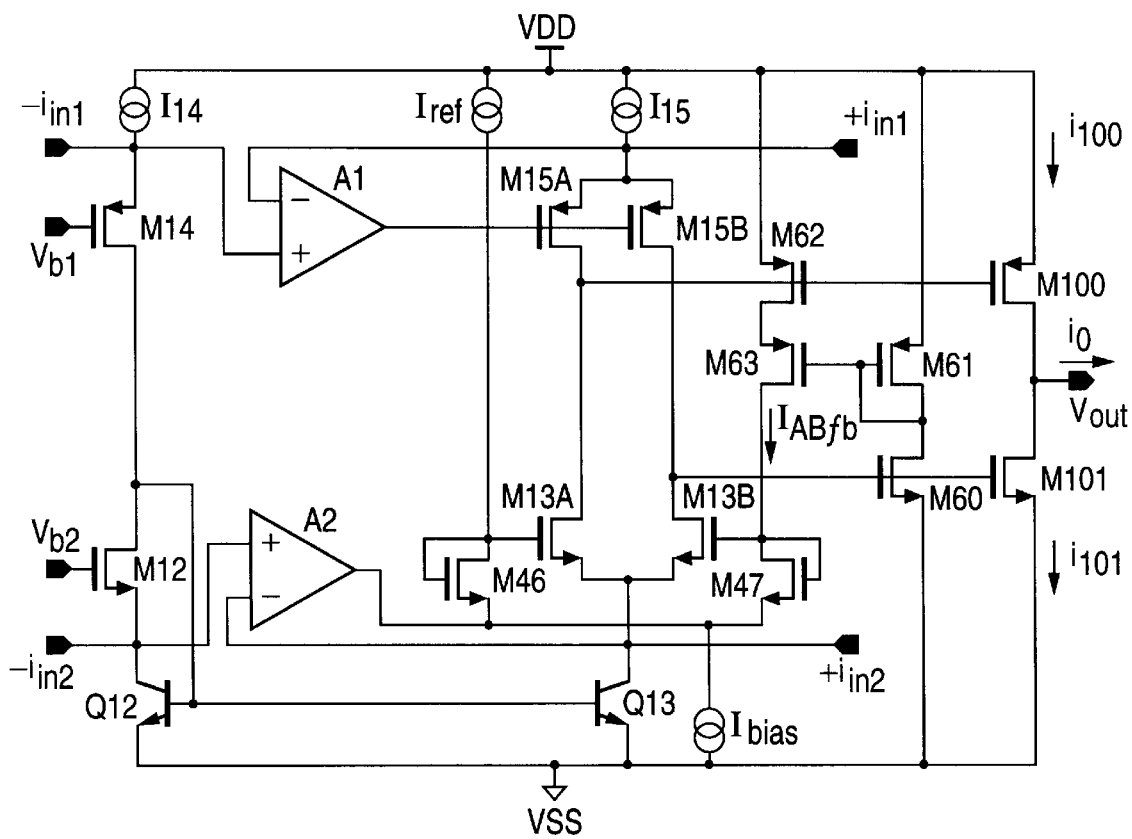
FIG. 4 is a schematic of a low voltage amplifier with gain boosting and reduced power supply voltage requirements in accordance with one embodiment of the present invention.
Figure 5:
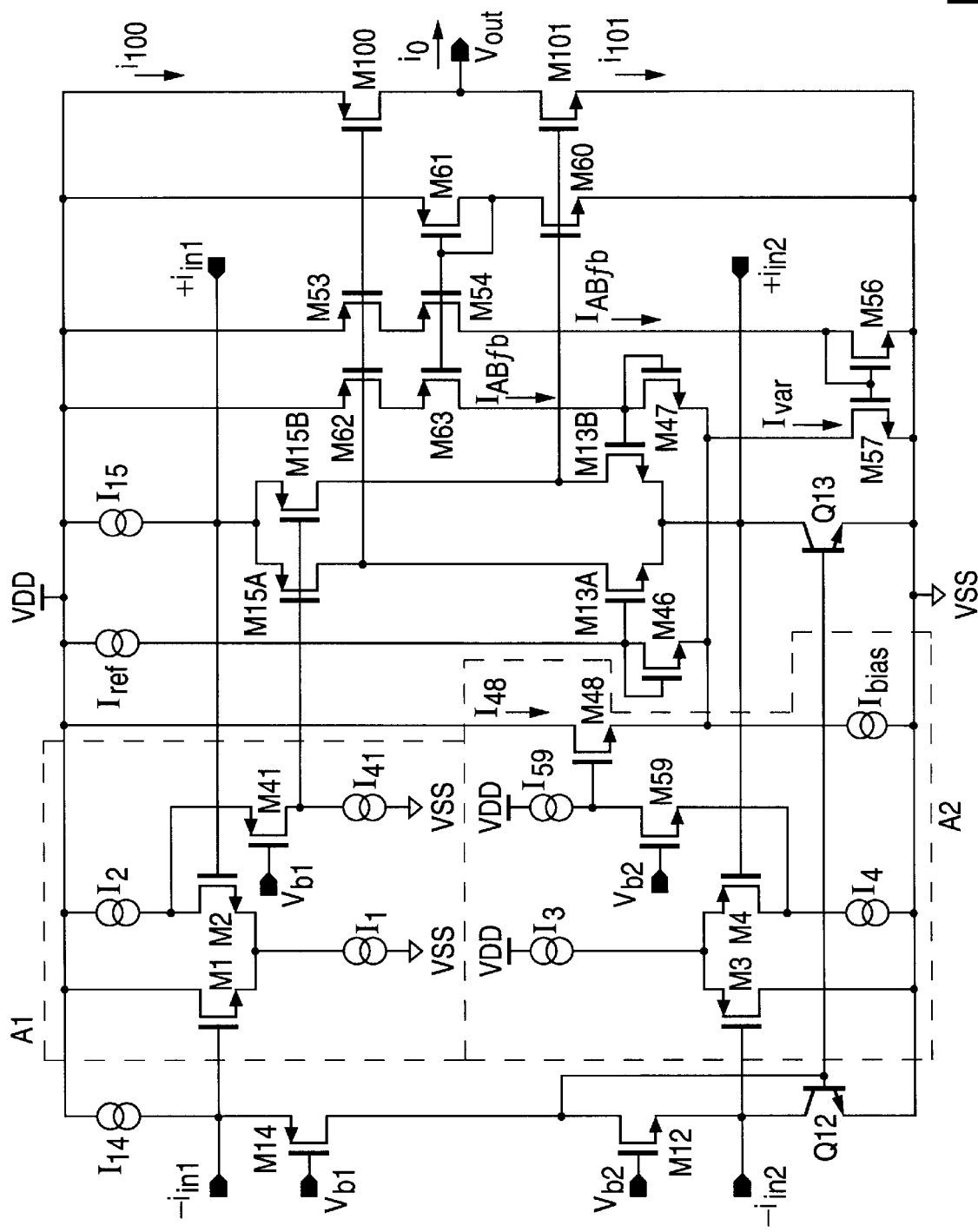
FIG. 5 is a more detailed schematic of the circuit of FIG. 4.

Referring to FIGS. 4 and 5, a low voltage amplifier with gain boosting and reduced power supply voltage requirements in accordance with one embodiment of the present invention uses gain boosting to increase the gain of the circuit of FIG. 3. Tithe two additional amplifiers A1, A2 provide gain boosting to cascode MOS transistors M15A, M15B, M13A and M13B and improve output impedance (as discussed above) by dynamically controlling the biasing at the gate terminals of transistors M15A, M15B, M13A and M13B.

As shown in more detail in FIG. 5, amplifier A1 is implemented using a cascode differential-to-single-ended amplifier (transistors M1, M2 and M41). The high output impedance of this amplifier A1 matches the high impedance load of the gate terminals of transistors M15A and M15B. Amplifier A2, however, requires a low impedance output since it is driving a low impedance load of diode connected transistors M46 and M47. Therefore, amplifier A2 is implemented by a cascode differential-to-single-ended amplifier (transistors M3, M4 and M59) followed by a voltage follower circuit in the form of source follower connected transistor M48.

The minimum required power supply voltage ($V_{DD(min)}-V_{SS}$) is established by the sum of the gate-source bias potential of transistor M101 (M100), the saturated drain-source bias potential of transistor M15B (M13A) and collector-emitter bias potential of current source 115 (transistor Q13). (Current sources 114 and 115 are preferably implemented using bipolar junction transistors, similar to the current sinks formed by transistors Q12 and Q13.) Accordingly, this circuit is suitable for operation with a 1.8 Volt power supply voltage.

Regarding amplifier A2, the bias current of the source follower transistor M48 is generated by two sinking currents: a fixed sinking current $I_{bias}$ and a variable sinking current $I_{var}$ which is generated by transistor M57. The fixed sinking current $I_{bias}$ draws the current necessary to bias the source follower transistor M48 and diode connected transistors M46 and M47. The variable sinking current $I_{var}$ draws a variable current which, due to the current replication provided by the current mirror circuit (transistors M56 and M57), is a multiple of the class AB feedback current $I_{ABfb}$. This variable sinking current $I_{var}$ through transistor M57 is needed to prevent a latch-up situation where the respective currents through the output transistors M100, M101 are large enough, and consequently the feedback current $I_{ABfb}$ is large enough, to provide all of the sink current $I_{bias}$ and thereby block the flow of current $I_{48}$ from the source follower transistor M48. Such a latch-up condition would render the class AB loop inoperative and allow a high quiescent current $i_{100}$, $i_{101}$ flow in the output transistors M100, M101. Accordingly, the variable sinking current $I_{var}$ provided by transistor M57 tracks the variations in the feedback current $I_{ABfb}$ and ensures that the source follower transistor M48 is always properly biased, thereby preventing any latch-up conditions.

Figure 1:
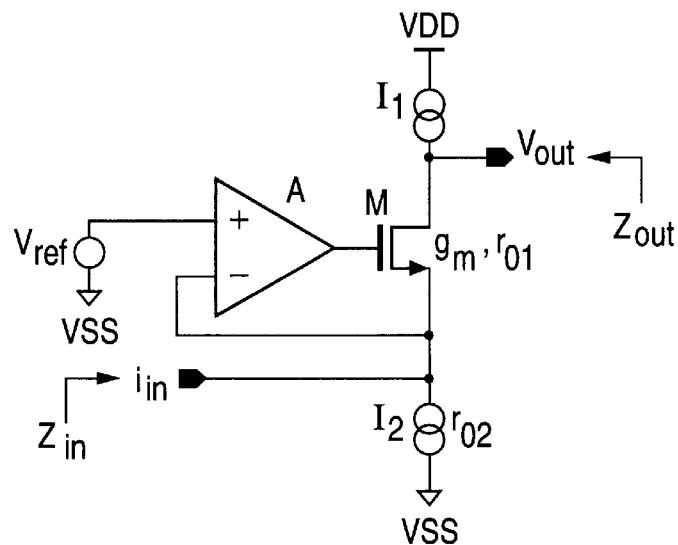
FIG. 1 is a schematic of a conventional gain boosting circuit.
Figure 2:
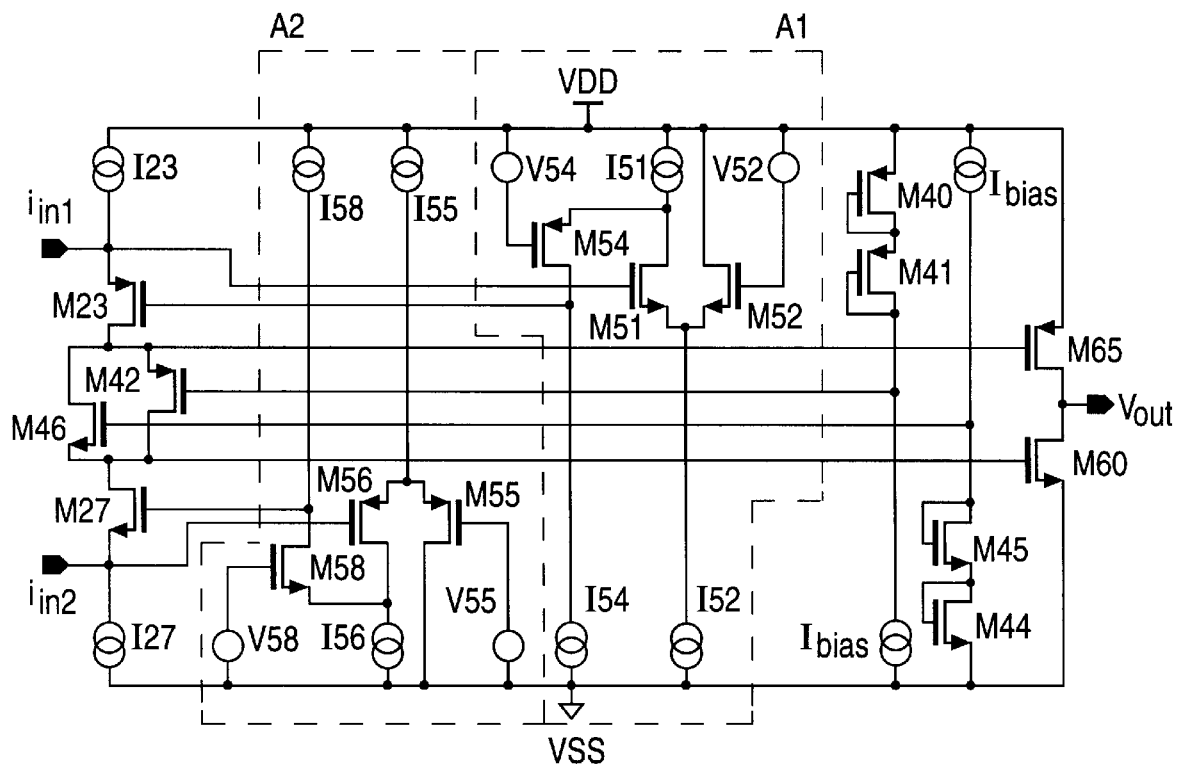
FIG. 2 is a schematic of a conventional circuit using gain boosting to achieve high DC gain.

Based upon the foregoing, it should be recognized that an amplifier in accordance with the present invention advantageously allows for operation with reduced power supply voltage requirements similar to that provided by a feedback design, such as that used in the circuit of FIG. 3, while simultaneously providing increased gain through the use of gain boosting similar to that provided by a feed forward design, such as that used in the circuit of FIG. 2. However, this circuit additionally introduces less noise and reduced offsets by virtue of its BiCMOS circuit implementation (i.e., due to the use of more bipolar devices and fewer MOS devices).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low voltage amplifier with gain boosting and a reduced power supply voltage requirement, comprising:

first and second power terminals configured to convey a power supply voltage;

a gain boost control circuit, coupled between said first and second power terminals, configured to receive said power supply voltage and a plurality of input signals and in accordance therewith provide a plurality of gain boost control signals;

a cascode amplifier circuit, coupled between said first and second power terminals and to said gain boost control circuit, configured to receive said power supply voltage, a portion of said plurality of input signals and said plurality of gain boost control signals and in accordance therewith provide a plurality of gain boosted signals which correspond to said plurality of input signals; and a class AB amplifier circuit, coupled between said first and second power terminals and to said cascode amplifier circuit, configured to receive said power supply voltage and said plurality of gain boosted signals and in accordance therewith provide a class AB output signal which corresponds to said plurality of input signals;

wherein said cascode amplifier circuit, said gain boost control circuit and said class AB amplifier circuit together operate with a minimum power supply voltage from said first and second power terminals which equals a sum of:

one active transistor input bias potential across
gate and source terminals of a metal oxide semiconductor field effect transistor, or
base and emitter terminals of a bipolar junction transistor;

one active transistor output bias potential across
drain and source terminals of another metal oxide semiconductor field effect transistor, or
collector and emitter terminals of another bipolar junction transistor; and another active transistor output bias potential across
drain and source terminals or still another metal oxide semiconductor field effect transistor, or
collector and emitter terminals of still another bipolar junction transistor.

2. The apparatus of claim 1, wherein said cascode amplifier circuit comprises:

a first dual cascode amplifier circuit configured to receive a first bias signal as a portion of said plurality of gain boost control signals and to receive a portion of a first differential input signal as a first portion of said plurality of input signals and in accordance therewith provide first and second cascode output signals as a portion of said plurality of gain boosted signals; and a second dual cascode amplifier circuit, telescopically coupled to said first dual cascode amplifier circuit, configured to receive a second bias signal as another portion of said plurality of gain boost control signals and to receive a portion of a second differential input signal as a second portion of said plurality of input signals and in accordance therewith provide third and fourth cascode output signals as another portion of said plurality of gain boosted signals.

3. The apparatus of claim 2, wherein said a class AB amplifier circuit is configured to receive and combine said first and third cascode output signals and receive and combine said second and fourth cascode output signals and in accordance therewith provide said class AB output signal, and wherein said class AB output signal corresponds to said first and second differential input signals.

4. The apparatus of claim 2, wherein said gain boost control circuit comprises:

a first bias signal generator circuit, coupled to said first dual cascode amplifier circuit, configured to receive said first differential input signal and in accordance therewith provide said first bias signal; and a second bias signal generator circuit, coupled to said second dual cascode amplifier circuit, configured to receive said second differential input signal and in accordance therewith provide said second bias signal.

5. The apparatus of claim 1, wherein said gain boost control circuit comprises first and second differential amplifier circuits.

6. The apparatus of claim 5, wherein:

said first differential amplifier circuit includes a cascode output stage; and said second differential amplifier circuit includes a cascode and voltage follower output stage.

7. The apparatus of claim 1, wherein said class AB amplifier circuit includes an output stage comprising:

an output terminal configured to convey an output voltage;

a voltage pullup circuit, coupled to said output terminal, configured to receive a portion of said plurality of gain boosted signals and in accordance therewith pull up said output voltage; and a voltage pulldown circuit, coupled to said output terminal, configured to receive another portion of said plurality of gain boosted signals and in accordance therewith pull down said output voltage.

8. The apparatus of claim 1, wherein said class AB amplifier circuit includes an output stage comprising:

an output terminal configured to convey an output signal;

a current sourcing circuit, coupled to said output terminal, configured to receive a portion of said plurality of gain boosted signals and in accordance therewith source a first output current to said output terminal; and a current sinking circuit, coupled to said output terminal, configured to receive another portion of said plurality of gain boosted signals and in accordance therewith sink a second output current from said output terminal.

9. The apparatus of claim 8, wherein:

said class AB amplifier circuit further includes a bias signal generator circuit, coupled to said output stage, configured to receive said plurality of gain boosted signals and in accordance therewith provide a bias signal; and said cascode amplifier circuit is further configured to receive said bias signal along with said portion of said plurality of input signals and said plurality of gain boost control signals and in accordance therewith provide said plurality of gain boosted signals.

10. The apparatus of claim 9, wherein:

said bias signal comprises a bias current; and said bias signal generator circuit comprises a current replication circuit configured to replicate one of said first and second output currents and in accordance therewith provide said bias current.

11. The apparatus of claim 1, wherein said sum of one active transistor input bias potential and two active transistor output bias potentials comprises a sum of:

a gate-source bias potential of a metal oxide semiconductor field effect transistor;

a saturated drain-source bias potential of another metal oxide semiconductor field effect transistor; and a collector-emitter bias potential of a bipolar junction transistor.

12. An apparatus including a low voltage amplifier with gain boosting using a dynamically biased cascode amplifier circuit, comprising:

a first bias signal generator circuit configured to receive a first differential input signal and in accordance therewith provide a first bias signal;

a second bias signal generator circuit configured to receive a second differential input signal and in accordance therewith provide a second bias signal;

a first dual cascode amplifier circlit, coupled to said first bias signal generator circuit, which includes first and second transistors with first and second bias terminals, respectively, configured to both receive said first bias signal, first and second input terminals, respectively, configured to both receive said portion of said first differential input signal, and first and second output terminals, respectively, configured to provide first and second cascade output signals, respectively;

a second dual cascode amplifier circuit, coupled to said second bias signal generator circuit and telescopically coupled to said first dual cascode amplifier circuit, which includes third and fourth transistors with third and fourth bias terminals, respectively, configured to both receive said second bias signal, third and fourth input terminals, respectively, configured to both receive said portion of said second differential input signal, and third and fourth output terminals, resrectively, configured to provide third and fourth cascade output signals, respectively; and a class AB amplifier circuit, coupled to said first and second dual cascode amplifier circuits, configured to receive and combine said first and third cascode output signals and receive and combine said second and fourth cascade output signals and in accordance therewith provide a class AB output signal which corresponds to said first and second differential input signals.

13. The apparatus of claim 12, wherein said first and second bias signal generator circuits, said first and second dual cascode amplifier circuits and said class AB amplifier circuit together operate with a minimum power supply voltage which equals a sum of one active transistor input bias potential and two active transistor output bias potentials.

14. The apparatus of claim 12, wherein said first and second bias signal generator circuits comprise first and second differential amplifier circuits, respectively.

15. The apparatus of claim 14, wherein:

said first differential amplifier circuit includes a cascode output stage; and said second differential amplifier circuit includes a cascode and voltage follower output stage.

16. The apparatus of claim 12, wherein:

said first dual cascode amplifier circuit and said first bias signal generator circuit together comprise a first gain boosting circuit for said first differential input signal; and said second dual cascode amplifier circuit and said second bias signal generator circuit together comprise a second gain boosting circuit for said second differential input signal.

17. The apparatus of claim 12, wherein said class AB amplifier circuit includes an output stage comprising:

an output terminal configured to convey an output voltage;

a voltage pullup circuit, coupled to said output terminal, configured to receive said combined first and third cascode output signals and in accordance therewith pull up said output voltage; and a voltage pulldown circuit, coupled to said output terminal, configured to receive said combined second and fourth cascode output signals and in accordance therewith pull down said output voltage.

18. The apparatus of claim 12, wherein said class AB amplifier circuit includes an output stage comprising:

an output terminal configured to convey an output signal;

a current sourcing circuit, coupled to said output terminal, configured to receive said combined first and third cascode output signals and in accordance therewith source a first output current to said output terminal; and a current sinking circuit, coupled to said output terminal, configured to receive said combined second and fourth cascode output signals and in accordance therewith sink a second output current from said output terminal.

19. The apparatus of claim 18, wherein:

said class AB amplifier circuit further includes a third bias signal generator circuit, coupled to said output stage, configured to receive said combined first and third cascode output signals and said combined second and fourth cascode output signals and in accordance therewith provide a third bias signal; and said second dual cascode amplifier circuit is further configured to receive said third bias signal along with said second bias signal and said portion of said second differential input signal and in accordance therewith provide said third and fourth cascode output signals.

20. The apparatus of claim 19, wherein:

said third bias signal comprises a bias current; and said third bias signal generator circuit comprises a current replication circuit configured to replicate one of said first and second output currents and in accordance therewith provide said bias current.

\* \* \* \* \*

UNITED STATES PATENT AND TRADEMARK OFFICE
CERTIFICATE OF CORRECTION

PATENT NO: 6,127,891

DATED: October 3, 2000

INVENTOR(S): RUDY G.H. ESCHAUZIER and REHAN A. ZAKAI

It is certified that error appears in the above-identified patent and that said Letters Patent are hereby corrected as shown below:

In Col. 6, line 19, delete "or" and replace with --of--.

In Col. 7, line 60, delete "circlit" and replace with --circuit--.

In Col. 8, line 2, delete "cascade" and replace with --cascode--.

Signed and Sealed this

Seventeenth Day of April, 2001

*Attest:*

NICHOLAS P. GODICI

*Attesting Officer*       Acting Director of the United States Patent and Trademark Office